United States Patent [19]

Takada et al.

[11] Patent Number: 4,907,052
[45] Date of Patent: Mar. 6, 1990

[54] SEMICONDUCTOR TANDEM SOLAR CELLS WITH METAL SILICIDE BARRIER

[75] Inventors: Jun Takada, Kobe; Minori Yamaguchi, Akashi; Yoshihisa Tawada, Kobe, all of Japan

[73] Assignee: Kanegafuchi Kagaku Kogyo Kabushiki Kaisha, Osaka, Japan

[21] Appl. No.: 300,191

[22] Filed: Jan. 23, 1989

Related U.S. Application Data

[63] Continuation of Ser. No. 154,487, Feb. 8, 1988, abandoned, which is a continuation of Ser. No. 781,577, Sep. 30, 1985, abandoned.

[30] Foreign Application Priority Data

Oct. 11, 1984 [JP] Japan .............................. 59-213944

[51] Int. Cl.$^4$ ............................................ H01L 27/14
[52] U.S. Cl. ........................................ 357/30; 357/59; 357/71; 357/67; 357/58
[58] Field of Search ................... 357/30 K, 30 J, 30 P, 357/59 D, 71 S, 58, 67 S, 49, 54, 63, 65

[56] References Cited

U.S. PATENT DOCUMENTS

| | | |
|---|---|---|
| 3,961,357 | 6/1976 | Okuhara et al. ................... 357/49 X |
| 4,190,852 | 2/1980 | Warner, Jr. ................... 357/30 K X |
| 4,272,641 | 6/1981 | Hanak ........................... 357/30 J X |
| 4,316,049 | 2/1982 | Hanak ........................... 357/30 J X |
| 4,415,760 | 11/1983 | Madan ............................. 357/30 X |
| 4,479,027 | 10/1984 | Todorof ......................... 357/30 J X |
| 4,522,663 | 6/1985 | Ovshinsky et al. .......... 357/30 K X |
| 4,536,607 | 8/1985 | Wiesmann ..................... 357/30 K X |
| 4,598,306 | 7/1986 | Nath et al. ......................... 357/30 X |
| 4,604,636 | 8/1986 | Dalal ............................. 357/30 K X |
| 4,728,370 | 3/1988 | Ishii et al. ..................... 357/30 K X |

OTHER PUBLICATIONS

Murarka et al., "Refractory Silicides of Titanium and Tantalum for Low-Resistivity Gates and Interconnects," IEEE Journal of Solid-State Circuits, vol. 5C-15, No. 4, Aug. 1980, pp. 474–482.

Sequeda, "The Role of Thin Film Materials on the Technology of Integrated Circuit Fabrication," *Journal of Metals*, Nov. 1985, pp. 54–59.

Wiltmer, "Tin and Tan as Diffusion Barriers in Metallizations to Silicon Semiconductor Devices," *Appl. Phys. Lett.* 36(6), 15 Mar. 1980, pp. 456–458.

Chiang et al, RCA Review, vol. 38, No. 3, Sep. 1977, pp. 390–405.

Tawada et al, Japanese Journal of Applied Physics, vol. 21, Suppl. 21-1, 1982, pp. 297–303.

*Primary Examiner*—William Mintel
*Attorney, Agent, or Firm*—Armstrong, Nikaido, Marmelstein, Kubovcik & Murray

[57] ABSTRACT

A heat-resistant multijunction semiconductor device comprising a p-layer, a n-layer and a diffusion-blocking layer, the diffusion-blocking layer being provided between the p-layer and the n-layer. The semiconductor device can reduce the deterioration in quality which is caused by the diffusion of dopant atoms in the p-layer and n-layer, respectively, into the other layer.

15 Claims, 2 Drawing Sheets

SEMICONDUCTOR TANDEM SOLAR CELLS WITH METAL SILICIDE BARRIER

This application is a continuation of of application Ser. No. 154,487 filed Feb. 8, 1988, now abandoned, which is a continuation of application Ser. No. 781,577 filed Sept. 30, 1985, now abandoned.

BACKGROUND OF THE INVENTION

The present invention relates to a multijunction semiconductor device.

A multijunction semiconductor is one having a plurality of pin-junctions and/or pn-junctions. The structure thereof is a multilayered pinpin . . . structure or a pnpnpn . . . structure, and a recombination of carriers occurs at the p/n interface. A multijunction semiconductor of a amorphous silicon is used as a solar cell capable of generating a high-voltage, and also is used as a photo-sensor, rectifier, and the like.

It is considered that properties of such devices are not considerably so deteriorated by light because the thickness of the i-layer on the light-incident side can be relatively small as compared with the thickness of that in a singlejunction photoelectric device. However, a multijunction semiconductor has a disadvantage in that the Group III atom and/or the Group V atom in the p-layer and n-layer, respectively, are diffused to the other layer through a p/n interface, so that a p/n interface does not function well. Thus, properties of such devices are deteriorated by heat owing to thermal diffusion of dopant atoms. Especially, when an amorphous silicon solar cell is used in the open air, the temperature of the surface of the solar cell reaches about 80° C., so that the properties of the solar cell, e.g. short circuit current, open circuit voltage, fill factor, and the like are remarkably lowered, and as a result, conversion efficiency of the solar cell is decreased. This is because a thermal diffusion easily takes place in a hydrogenated amorphous semiconductor as compared with that of a single crystalline semiconductor.

Besides, a reduction of quality of a multi-junction semiconductor also occurs on a surface between a metal electrode and a semiconductor layer owing to a thermal diffusion of metal to the semiconductor that comes in contact with the electrode, such as disclosed by Takada et al in U.S. patent application No. 744,599 and 744,602 respectively filed on June 14, 1985.

An object of the present invention is to provide a heat-resistant multijunction semiconductor device capable of reducing the decrease in quality of a p-layer and a n-layer owing to diffusion of dopant atoms through a surface of the p/n interface when the multijunction semiconductor device is used at a high temperature.

This and other objects of the invention will become apparent from the description hereinafter.

SUMMARY OF THE INVENTION

In accordance with the present invention, there is provided a multijunction semiconductor device which comprises a p-type semiconductor layer, an n-type semiconductor layer, and a diffusion-blocking layer.

The thermal diffusion of the Group III dopant atom of the p-layer is blocked by the diffusion-blocking layer which is provided between the n-layer and the p-layer. The thermal diffusion of the group V dopant atom of the n-layer is also blocked by the diffusion-blocking layer. The multijunction semiconductor device of the invention has resistive properties against heat and light.

DETAILED DESCRIPTION

Figure 1:
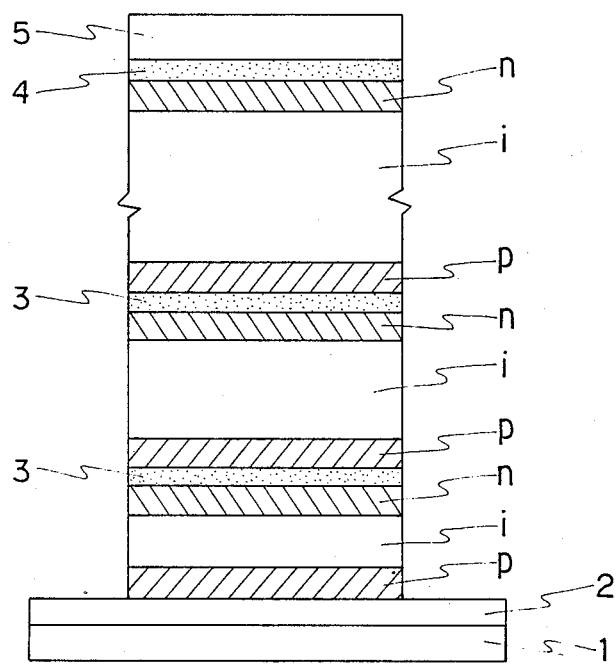
FIG. 1 is a schematic sectional view of the multijunction semiconductor device of the present invention.

In a heat-resistant multijunction semiconductor of the present invention, the semiconductor is not particularly limited, and an amorphous semiconductor or an amorphous semiconductor including crystalline plates can be used. Examples of such semiconductors are a-Si:H, a-Si:F:H, a-SoGe:H, A-SiSn-H, a- SiN :H, a-SiGe:F:H, a-SiSN:F:H, a-Si:N:F:H, a-SiC:H, a-SiC:F:H, a-SiO:H, a-SiO:F:H, $\mu$c-Si:H, $\mu$c-Si-H:F, $\mu$c:SiSn:H and the like, wherein a-indicates amorphous, $\mu$c-indicates microcrystalline and Si:H indicates hydrogenated silicon with its dangling bonds being terminated with hydrogen atoms. A semiconductor can be doped with dopants to form a p-type or n-type semiconductor, as known to those skilled in the art.

A diffusion-blocking layer is provided between a n-type semiconductor layer and a p-type semiconductor layer. The diffusion-blocking layer avoids diffusion of trivalent or pentavalent dopant atom into another doped semiconductor, while the atoms that constitute the diffusion-blocking layer do not diffuse to a semiconductor because the atoms in the diffusion-blocking layer are combined with silicon atoms to form a stable compound, thus the diffusion-blocking layer is composed of a stable material, namely a chemical compound or alloy which has a high melting point. Moreover, the atoms in the diffusion-blocking layer do not have a harmful influence on the electric properties of the semiconductor, such as dark conduction, photo-conduction, activation energy, and the like.

The diffusion-blocking layer also functions as a blocking layer of metal atoms which are diffused from an electrode to a semiconductor layer. For this purpose, the diffusion-blocking layer is provided between a semiconductor layer and an electrode.

Examples of materials that form the diffusion-blocking layer of the invention are silicide-formable metals. Such a metal reacts with silicon atoms in the semiconductor layer, and forms a thin layer of metal silicide, whereby a diffusion of dopant atoms is prevented. Thus, a layer of silicide-formable metal includes a thin layer of its silicide on both sides thereof, i.e. on an interface between the layer of silicide-formable metal and a layer of semiconductor. The silicide-formable metals are metals of the Groups IA, IIA (excepting Be), IIIB, IVB, VB, VIB, VIIB (excepting Tc) and VIII of the Periodic Table. Specific examples of silicide-formable metals are Sr, Ba, Ti, Zr, Hf, V, Nb, Ta, Cr, Mo, W, Mn, Re, Fe, Ru, Os, Co, Ir, Ni and Pt. A metal of the Group VIB is preferably since the material does not cost much and a layer is thereof is easily formed on the semiconductor. Especially, chromium or metal alloy containing more than 50% of chromium is preferable.

Other Examples of materials that form the diffusion-blocking layer are silicides of metals of the Groups IA, IIA (excepting Be), IIIB, IVB, VB, VIB, VIIB (excepting Tc) and VIII of the Periodic Table. Specific examples of metal silicides are strontium silicide, barium silicide, titanium silicide, zirconium silicide, hafnium silicide, vanadium silicide, niobium silicide, tantalum silicide, chromium silicide, molybdenum silicide, tungsten silicide, manganese silicide, rhenium silicide, iron silicide, ruthenium silicide, osmium silicide, cobalt silicide, iridium silicide, nickel silicide, and platinum silicide. Among those silicides, a silicide of a Group VIB metal of the Periodic Table or a silicide of a metal alloy containing more than 50 atomic % of Group VIB metal is preferable, since the material does not cost much and a layer thereof is easily formed on the semiconductor. Especially, chromium silicide or silicide of metal alloy containing more than 50 atomic % of chromium is preferable. The content of metal in the metal silicide is 1 atomic % to 90 atomic %, preferably 10 atomic % to 90 atomic %. When the content of metal is less than 1 atomic %, the thermal diffusion of the dopant atoms cannot be avoided. When the content of metal is more than 90 atomic %, light is greatly absorbed into the layer, and photoelectric properties of the devices are reduced.

Still other Examples of materials of the diffusion-blocking layer are nitrides having a high melting point, such as titankium nitride, and the like.

Further still other Examples of materials of the diffusion-blocking layer are oxides having high electric conductivity and light-transparency, such as indium tin oxide (ITO), indium oxide ($In_2O_3$), tin oxide ($SnO_2$), cadmium tin oxide ($Cd_xSnO_y$, x=0.5 to 2, y=2 to 4), and the like. Such transparent conducting oxide is preferably used for a semiconductor device wherein light is necessary, e.g. a photovoltaic device.

In addition to the above examples of materials, any insulator such as $SiO_2$, SiC, SiN, $TiO_2$, or the like can form the diffusion-blocking layer so far as the insulator is thin enough to let carriers pass through the layer by tunneling. As an example of an insulator, $SiO_2$ in a thickness of less than 10 Å can be employed. When the thickness of $SiO_2$ is less than 10 Å, a tunneling takes place as described by M. A. Nicolet in *Thin Solid Films*, 52, pages 415 to 443 (1978).

A semiconductor excluding hydrogen can also be a material of the diffusion-blocking layer for blocking diffusion of dopant atoms. Matsumura et al decribe in Japanese Journal of Applied Physics, Vol. 22 No. 5, pages 771 to 774 (1973), that the diffusion coefficient of inpurities in a hydrogenated amorphous silicon is much larger than that in a crystalline silicon. For example, a diffusion coefficient in the hydrogenated amorphous silicon is 10 orders as large as that in the crystalline silicon at 300° C. Matsummura et al conclude that the cause of the above large diffusion coefficient is the existence of hydrogen atom contained in the film because the above diffusion coefficient is nearly the same as the diffusion coefficient of a hydrogen atom in a-Si:H. Therefore, a semiconductor which does not include hydrogen atom can be a material of the diffusion-blocking layer of the invention.

A plurality of the diffusion-blocking layers of the invention can be provided in a multijunction semi-conductor device. For example, a multilayered structure of . . . /p-layer/diffusion-blocking layer/metal/diffusion-blocking layer/n-layer/ . . . can be designed in a multijunction semiconductor device. In the above-structure, the diffusion-blocking layer is made of a metal silicide. The metal does not necessary form a silicide with silicon to block dopant atoms. The metal can be a transparent conducting oxide for a photovoltaic device, and can be any metal for a device which does not need light, such as a rectifier.

As described above, various materials can be employed for the diffusion-blocking layer of the invention. Among them, a metal silicide or a silicide-formable metal is preferable. A layer of metal silicide or silicide-formable metal can fully block the dopant atoms, and is thin, conductive and light-transparent. Accordingly, it does not require much cost or time for preparation.

An electrode is placed on either or both sides of the semiconductor layer. For an electrode, any metal or alloy is possibly used as far as it is commonly used as a material of a backing electrode. For instance, Al, Ag, Au, Cu, brass, Zn, or the like is used as a backing electrode. In addition to those metals, any metal or alloy having the same physico-chemical properties can be used. However, a metal which forms silicide is less suitable as the material of the backing electrode since such a metal has a long electric conductivity and low light-reflectivity. For an electrode on the light-incident side, a transparent conducting oxide is used.

When a diffusion-blocking layer is applied to a device that does not need light, e.g. a rectifier, the thickness of the diffusion-blocking layer is in a range of a few Å to 100 $\mu$m. The upper limit of the range is not concerned with electric properties of the device so far as the desired electric conductivity of the layer can be maintained, or the diffusion-blocking layer does not obstruct a recombination of carriers. The upper limit is rather selected from the viewpoint of the film-forming period for a device.

On the other hand, in a photoelectric device, the upper limit of the thickness of the diffusion-blocking layer is slected from a viewpoint of light-transmission through the layer. The thickness must be determined so that the loss of light is less than 90% in the diffusion-blocking layer. The loss of light is preferably less than 50%. Especially, the loss of light is less than 20% in a photovoltaic device. For example, the thickness d can be determined from the following relationship:

$$d \leq -\ln(L/100)/\alpha$$

where, L is a loss (%) of the layer, and $\alpha$ is a light-absorption coefficient of the layer. It is a matter of course that the above condition is not applied to a device which does not need a light. The lower limit is selected so that the layer effectively avoids the diffusion of dopant atoms.

From another point of view, a thickness of the diffusion-blocking layer is determined from the following relationship:

$$d \geq \sqrt{D(T)\tau}$$

where, $\tau$ is a required life time of the device, T is a surrounding temperature, D(T) is a diffusion coefficient of a dopant atom in the layer and is given as follows:

$$D(T) = Do \exp(-Ea/kT) \ (cm^2/s)$$

where, Ea is an activation energy.

In conclusion, a thickness of the diffusion-blocing layer of conductor is above 2 Å. Expecially, a thickness of the layer of transparent conducting oxide is about 5 Å when a light is not necessarily used in a device suce as a diode or when a light does not need to pass through the diffusion-blocking layer in a device such as a switching device, and is 5 Å to 1 μm when a light is used in a device such as a photovoltaic device. The thickness of the layer of metal silicide containing a metal in a range of 10 to 90 atomic % is 2 to 1000 Å, preferably 5 to 500 Å and most preferably 10 to 200 Å when light is used in a device, and is above 2 Å when light is not necessarily used in a device. The thickness of the layer of silicide-formable metal is 10 Å to 100 μm and preferably 30 Å to 10 μm. In the case of silicide-formable metal, the metal constitutes the diffusion-blocking layer having a thickness which is enough to form a thin layer of metal silicide on both sides thereof, i.e. on an interface between a semiconductor layer and the diffusion-blocking layer. The thickness of the layer of insulator is 2 to 40 Å and preferably 2 to 20 Å. The thickness of the layer of semiconductor such as a-Si, a-Ge, a-SiGe, or the like excluding hydrogen is 5 to 5000 Å.

The thickness of the deposited diffusion-blocking layer can be measured by a method of quartz crystal oscillator, or can be decided from an analytical curve obtained by means of SIMS. In the SIMS method, a calibration curve of thickness versus depositing time is obtained by a tally step method before deposition. The thickness is determined and controlled from the calibration curve. The thickness of the layer of silicide-formable metal is determined from an assumption that the content of metal is about 50 atomic % in the layer and the thickness is twice as large as the thickness of a layer of metal alone. Thus, the thickness of the deposited silicide-formable metal is about a half of the thickness which is measured by SIMS method.

Preferably, the electric conductivity of the diffusion-blocking layer is more than $10^{-8}(\Omega\cdot cm)^{-1}$, and can be equal to or more than the electric conductivity of doped p- or n-layer. Even when the electric conductivity of the diffusion-blocking layer is less than $10^{-8}(\Omega\cdot cm)^{-1}$, the electric properties of the device are not affected by the existence of the layer so far as the thickness of the layer is thin and carriers can pass through the layer by tunneling.

The relationship between the thickness of the diffusion-blocking layer and the electric conductivity is as follows:

$$d/\sigma \leq 10(\Omega cm^2)$$

where, d is the thickness of the layer and $\sigma$ is the electric conductivity of the layer. For example, the thickness d should be less than 100 Å where $\sigma$ is $10^7(\Omega cm)^{-1}$.

A process for preparing a multijunction semiconductor device of the present invention is hereinafter explained referring to FIG. 1. In the following descrption, a multijunction a-Su:H solar cell is illustrated as a preferred embodiment of the invention.

Amorphous p-, i- and n-layer are successively formed on a transparent electrode 2 which is readily provided on a transparent substrate (glass substrate) 1. Thereon a material of the diffusion-blocking layer 3 is deposited.

When a silicide-formable metal is selected as the material, both the sputtering method and electron-beam-evaporation method can be employed. In the sputtering method, a silicide-formable metal is selected as a target.

In the case that a metal silicide is employed as a depositing member, a layer of metal silicide is formed by depositing a metal silicide compound by means of electron-beam-evaporation or sputtering. However, another method can also be employed wherein a metal is deposited by the use of a sputtering target and simultaneously silicon is deposited by glow-discharge decomposition. A co-sputtering process can also be employed for deposition of the layer, wherein sputtering of metal and sputtering of silicon are carried out simultaneously.

The preparation of the meta silicide layer is also performed by depositing only silicide-formable metal on a p-type or a n-type semiconductor layer, and thereon depositing a n-type or a p-type semiconductor, and if necessary, annealing the deposited layer for 0.5 to 4 hours at 80° C. to 400° C. The deposited layer can be annealed after providing an electrode on the semiconductor. The annealing process can be excluded provided that the depositing time or the temperature of the substrate is suitably controlled during deposition of silicide-formable metal or a semiconductor on the diffusion-blocking layer. A reaction of the metal with silicon in the semiconductor takes place to form metal silicide. In the method, a metal silicide layer of 5 to 300 Å thickness is obtained.

In case that a transparent conducting oxide is selected for a depositing member, either of an electron-beam-evaporation or sputtering can be employed. The target is made of the material to be deposited on the semiconductor, i.e. $In_2O_3$ is selected as a target to form a film of $In_2O_3$, $SnO_2$ is selected as a target to form a film of $SnO_2$, and $In_2O_3$ and $SnO_3$ are both selected as targets to form a film of indium tin oxide (ITO).

In the case that a titanium nitride is selected for a depositing member, a RF reactive sputtering method can be employed wherein titanium is a target in an atmosphere of a mixed gas of nitrogen and argon.

Under the above-mentioned depositing processes, a diffusion-blocking layer 3 is formed in a prescribed thickness on the pin-semiconductor. If necessary, the process can be repeated as shown in FIG. 1. On the last n-layer, the diffusion-blocking layer 4 can be provided so as to block the diffusion of atom in a metal electrode as described in the foregoing. Thereon a metal electrode 5 is provided in a prescribed thickness on the last n-layer as a backing electrode. Thereafter, the solar cell of the preferred embodiment is annealed at a temperature of 150° to 400° C. for 0.2 to 5 hours so that the diffusion-blocking layer comes in contact more closely with the a-Si:H semiconductor. In the annealing process, the atom that constitutes the diffusion-blocking layer and the silicon atom in a-Si:H layer react with each other.

In the conventional multijunction a-Si:H solar cell wherein a diffusion-blocking layer is not provided between the p/n interface, the conversion efficiency under a condition of Am-1, 100 mW/cm² is reduced to about 50% of the initial value after heating it at a temperature of about 200° C. for several hours. On the other hand, the multijunction a-Si:H solar cell prepared by the aforementioned process has an advantage in that its conversion efficiency is hardly reduced by heating.

In Table 1 and Table 2, there are shown various types of pin-multijunction semiconductor devices wherein the diffusion-blocking layer of the invention is provided. In Table 1 and Table 2, SUS indicates a steel use stainless of 0.1 mm thick on which a polyimide thin film is provided, and Glass indicates a glass substrate of 2 mm thick. A-si:H semiconductors are formed by glow-discharge CVD (chemical vapor deposition) method, Cr, Al and Ag electrodes are formed by electron-beam evaporation method, and $SnO_2$ electrode is formed by sputtering method. BL means a diffusion-blocking layer.

The pin-multijunction a-Si:H solar cell of the present invention and its preparation are experimentally explained by the following Examples. It is to be understood that the present invention is not limited to the Examples, and various changes and modifications may be made in the invention without departing from the spirit and scope thereof.

TABLE 1

Structure of the multijunction device

| No. | Sub. | Electrode 1 (Å) | $BL_1$ (Å) | $p_1$ (Å) | $i_1$ (Å) | $n_1$ (Å) | $BL_2$ (Å) |
|---|---|---|---|---|---|---|---|
| 1 | SUS | Cr (2000) | CrSi (50) | a-Si:H (500) | a-Si:H (5000) | a-Si:H (500) | TiN (100) |
| 2 | Glass | $SnO_2$ (800) | — | a-Si:H (150) | a-Si:H (5000) | a-Si:H (500) | TiN (100) |
| 3 | Glass | $SnO_2$ (800) | — | a-Si:H (150) | a-Si:H (5000) | a-Si:H (500) | $SiO_2$ (8) |
| 4 | SUS | Cr (2000) | CrSi (50) | a-Si:H (500) | a-Si:H (5000) | a-Si:H (500) | $TiO_2$ (8) |
| 5 | Glass | $SnO_2$ (800) | — | a-Si:H (150) | a-Si:H (5000) | a-Si:H (500) | Si (100) |
| 6 | SUS | Al (2000) | CrSi (100) | a-Si:H (500) | a-Si:H (5000) | a-Si:H (500) | Si (100) |

Structure of the multijunction device

| No. | $p_2$ (Å) | $i_2$ (Å) | $n_2$ (Å) | $BL_3$ (Å) | Electrode 2 (Å) | Preferable Purpose |
|---|---|---|---|---|---|---|
| 1 | a-Si:H (500) | a-Si:H (5000) | a-Si:H (500) | CrSi (50) | Cr (2000) | Rectifier |
| 2 | a-Si:H (500) | a-Si:H (5000) | a-Si:H (150) | — | $SnO_2$ (800) | Optoelectric-sensor Solar Cell, |
| 3 | a-Si:H (500) | a-Si:H (5000) | a-Si:H (150) | — | $SnO_2$ (800) | Optoelectric-Sensor |
| 4 | a-Si:H (500) | a-Si:H (5000) | a-Si:H (500) | CrSi (50) | Cr (2000) | Rectifier Solar Cell, |
| 5 | a-Si:H (500) | a-Si:H (5000) | a-Si:H (150) | — | $SnO_2$ (800) | Optoelectric-Sensor |
| 6 | a-Si:H (500) | a-Si:H (5000) | a-Si:H (500) | CrSi (100) | Al (2000) | Rectifier |

TABLE 2

Structure of the multijunction device

| No. | Sub. | Electrode 1 (Å) | $BL_1$ (Å) | $p_1$ (Å) | $i_1$ (Å) | $n_1$ (Å) | $BL_2$ (Å) | | |
|---|---|---|---|---|---|---|---|---|---|
| 7 | Glass | $SnO_2$ (800) | — | a-Si:H (150) | a-Si:H (800) | a-Si:H (200) | CrSi (50) | ITO (1000) | CrSi (50) |
| 8 | SUS | Al (2000) | Si (50) | a-Si:H (500) | a-Si:H (5000) | a-Si:H (500) | MoSi (30) | Mo (2000) | MoSi (30) |
| 9 | Glass | $SnO_2$ (800) | — | a-Si:H (150) | a-Si:H (5000) | a-Si:H (500) | MoSi (30) | Mo (2000) | MoSi (30) |
| 10 | Glass | $SnO_2$ (800) | — | a-Si:H (150) | a-Si:H (5000) | a-Si:H (500) | CrSi (50) | Ag (2000) | CrSi (50) |
| 11 | Glass | Cr (2000) | CrSi (50) | a-Si:H (500) | a-Si:H (5000) | a-Si:H (500) | CrSi (50) | Al (2000) | CrSi (50) |

Structure of the multijunction device

| No. | $p_2$ (Å) | $i_2$ (Å) | $n_2$ (Å) | $BL_3$ (Å) | Electrode 2 (Å) | Preferable Purpose |
|---|---|---|---|---|---|---|
| 7 | a-Si:H (150) | a-Si:H (7000) | a-Si:H (500) | CrSi (50) | Ag (2000) | Solar Cell |
| 8 | a-Si:H (500) | a-Si:H (5000) | a-Si:H (500) | MoSi (50) | Al (2000) | Rectifier |
| 9 | a-Si:H (500) | a-Si:H (5000) | a-Si:H (150) | — | $SnO_2$ (800) | Optoelectric-Sensor Solar Cell |
| 10 | a-Si:H (500) | a-Si:H (5000) | a-Si:H (150) | — | $SnO_2$ (800) | Optoelectric-Sensor |
| 11 | a-Si:H (500) | a-Si:H (5000) | a-Si:H (500) | CrSi (50) | Cr (2000) | Rectifier |

EXAMPLE 1

On the glass substrate of 1 mm thick, the transparent $ITO/SnO_2$ electrode of 1,000 Å was provided.

The amorphous p-layer of 100 Å, i-layer of 400 Å and n-layer of 150 Å were successively deposited by means of glow-discharge decomposition. In the depositing process of p-type semiconductor, the gas wherein diborane ($B_2H_6$) was present in an amount of 0.1% by mole of monosilane ($SiH_4$) was decomposed at a temperature of 200° C. of the substrate and under a pressure of about 1 Torr. The n-layer was decomposed under a gas wherein phosphine ($PH_3$) was present in an amount of 0.2% by mole of monosilane ($SiH_4$). For depositing the i-layer, the mixed gas of monosilane and hydrogen was used.

On the pin-layer formed by the above-process, chromium was deposited in 20 Å by means of electron-beam-evaporation under a pressure of $10^{-6}$ Torr. Then, on the chromium layer, the amorphous pin-layer was again formed in thicknesses of 100 Å for p-layer, 900 Å for i-layer and 150 Å for n-layer. Thereon, the chromium was again deposited on the last n-layer. Then the pin-layer was again formed in thicknesses of 100 Å for p-layer, 5000 Å for i-layer and 150 Å for n-layer. Thereon chromium was deposited 20 Å thick for blocking the diffusion of the atom in the backing electrode, and aluminum was deposited on the chromium layer in 1200 Å as a backing electrode by electron-beam-evaporation, and thereafter the solar cell was annealed for 2 hours at 200° C., thereby assuring a close contact between the chromium layer and the semiconductor layer.

The characteristics of the obtained solar cell were measured under an exposure to a solar simulator under a condition of AM-1, 100 mW/cm² before and after heating it at 200° C. for 5 hours.

After heating, the conversion efficiency of the solar cell of Example 1 was 97% of the initial value of the solar cell before heating.

COMPARATIVE EXAMPLE 1

The solar cell was prepared in the same manner as in Example 1 except that the diffusion-blocking layer was not provided at all.

The characteristics before and after heating at 200° C. for 5 hours were measured. After heating, the conversion efficiency of the solar cell in Comparative Example 1 was 47% of the initial value of the solar cell before heating.

EXAMPLES 2, 3 AND COMPARATIVE EXAMPLE 2

Figure 2:
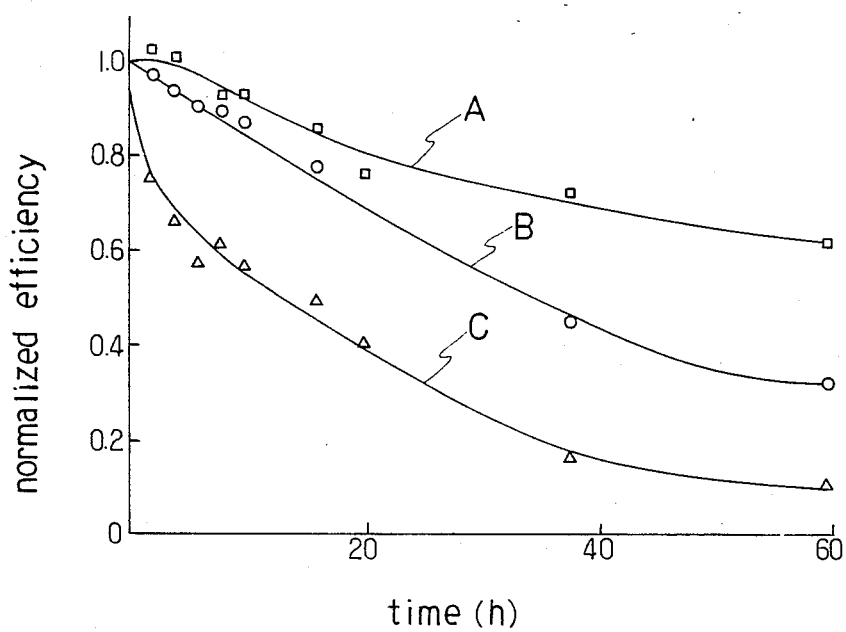
FIG. 2 is a graph showing the relationship between normalized efficiency of the solar cell and heating time.

An amorphous Si:H solar cell consisting of glass substrate/transparent electrode/pin-semiconductor/chromium silicide layer/pin-semiconductor/chromium silicide layer/silver electrode was prepared. The thickness of the chromium silicide layer wherein chromium is contained in an amount of about 50 atomic % was 40 Å. Another amorphous Si:H solar cell of the same structure was prepared, while the thickness of the chromium silicide layer was 80 Å. Still another solar cell of amorphous Si:H without the diffusion-blocking layer was prepared. The above three solar cells were heated at 230° C. for hours. The conversion efficiencies of the three solar cells were measured. The result is plotted in FIG. 2 versus heating time (hours). In FIG. 2, the line A and the line B indicate the normalized conversion efficiencies of the a-Si:H solar cell having a diffusion-blocking layer in 40 Å and 20 Å, respectively, and the line C indicates the normalized conversion efficiency of the a-Si:H solar cell without the diffusion-blocking layer. It is seen that an amorphous Si:H having a chromium silicide layer is heat-resistant, and the reduction of efficiency in the solar cell of 40 Å thickness of chromium silicide layer is less than that of 20 Å thickness.

EXAMPLES 4 AND COMPARATIVE EXAMPLE 3

Figure 3:
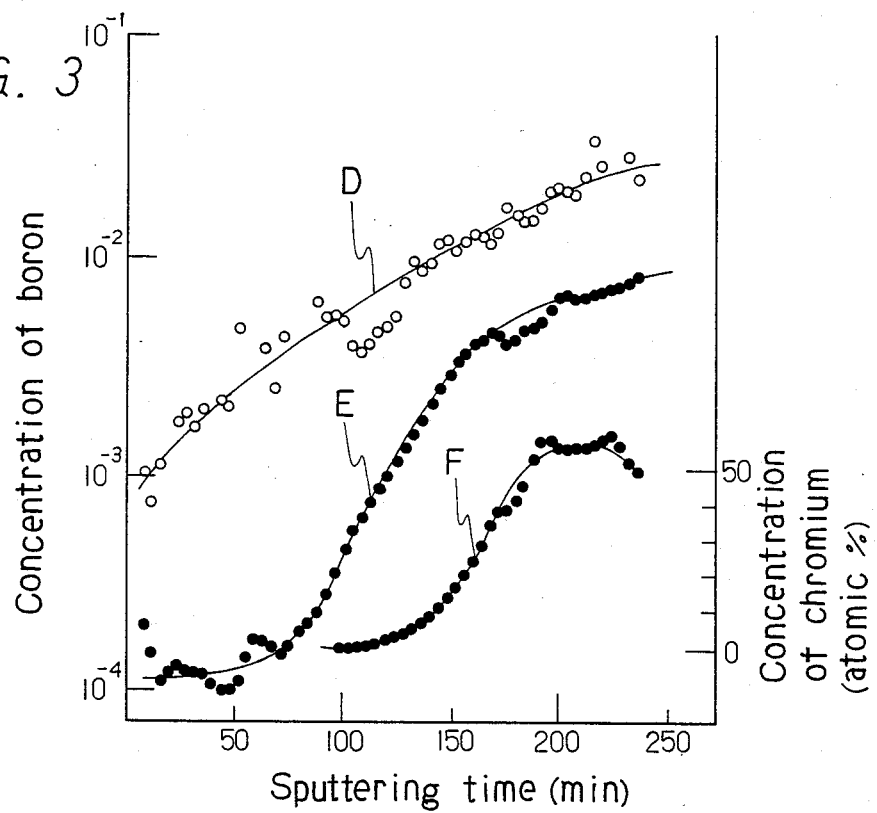
FIG. 3 is a graph of the concentration of boron and chromium after heating in a pn-structure measured from the surface of n-layer.

Two amorphous Si:H solar cells consisting of glass substrate/p-layer/n-layer, and glass substrate/p-layer/CrSi-diffusion blocking layer/n-layer were prepared, respectively. The thickness of the p- and n-layer were 500 Å, respectively. Chromium was deposited in 20 Å and the thickness of CrSi was estimated as 40 Å. The two samples were heated at 230° C. for 7 hours. The concentration of boron and chromium were respectively measured by SIMS method wherein sputtering was performed from the surface of the n-layer. FIG. 3 shows the result. The sputtering time relates to the depth of the sample measured from the surface of the n-layer. The time of 0 minute corresponds to a surface of the n-layer. The time of about 200 minutes corresponds to the depth of the location of the p/n interface. In the sample where the diffusion-blocking layer was not provided (curve D), boron was diffused to the depth of the n-layer, while in the sample where the diffusion-blocking layer was provided (curve E), the amount of boron in the n-layer is relatively small. Curve F indicates the concentration of chromium in the semiconductor. It is seen that the concentration of chromium is high near the p/n interface.

EXAMPLE 5 AND COMPARATIVE EXAMPLES 4 AND 5

Figure 4:
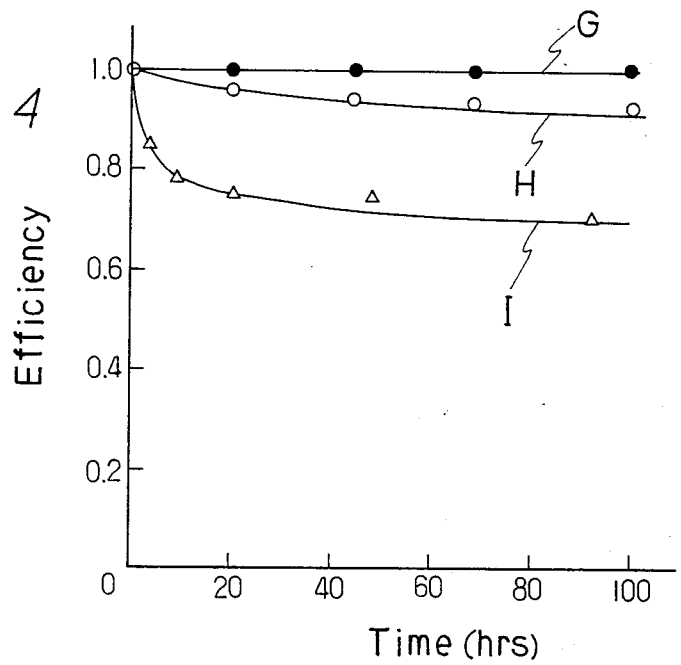
FIG. 4 is a graph showing efficiencies of pin solar cells under an exposure to light.

Three amorphous Si:H solar cells were prepared as in Table 3. The samples were exposed to a metal halide lamp of 100 mW/cm$^2$ available from Toshiba corp., under a trade designation Yoko lamp DR400/T. FIG. 4 shows the efficiencies of the samples under exposure to light. The exposing time was 0 to 100 hours. The sample G in Table 3 did not show a deterioration of efficiency under an exposure of light for 1000 hours (not shown in FIG. 4).

According to the present invention, there is provided a heat-resistant multijunction semiconductor device having a diffusion-blocking layer between the p-layer and the n-layer of the semiconductor device. The diffusion-blocking layer prevents dopant atoms in the p-layer and the n-layer, respectively, from diffusing into the other layer. The characteristics of the semiconductor device of the invention are not lowered even at a high temperature. Therefore, the semiconductor device of the invention is effectively applied to a solar cell which is used at a high temperature.

TABLE 3

| Sample | Substrate | Electrode 1 (Å) | p$_1$ (Å) | i$_1$ (Å) | n$_1$ (Å) | BL$_1$ (Å) | p$_2$ (Å) | i$_2$ (Å) | n$_2$ (Å) | BL$_2$ (Å) | Electrode 2 (Å) |
|---|---|---|---|---|---|---|---|---|---|---|---|
| G Ex. 5 | glass | SnO$_2$ (4000) | a-Si:H (150) | a-Si:H (800) | a-Si:H (200) | CrSi (80) | a-Si:H (150) | a-Si:H (7000) | a-Si:H (300) | CrSi (40) | Ag (2000) |
| H Com. Ex. 4 | glass | SnO$_2$ (4000) | a-Si:H (150) | a-Si:H (800) | a-Si:H (200) | — | a-Si:H (150) | a-Si:H (7000) | a-Si:H (300) | CrSi (40) | Ag (2000) |
| I Com. Ex. 5 | glass | SnO$_2$ (4000) | a-Si:H (150) | a-Si:H (7000) | a-Si:H (300) | CrSi (40) | — | — | — | — | Ag (2000) |

What we claim is:

1. A multijunction semiconductor device comprising at least one p-type semiconductor layer, at least one n-type semiconductor layer and at least one dopant diffusion-blocking layer, wherein each semiconductor layer is made of a material selected from the group consisting of amorphous semiconductor material and amorphous semiconductor material containing microcrystals, said dopant diffusion-blocking layer being provided between a p-type semiconductor layer and an n-type semiconductor layer which would be in contact with each other if the dopant diffusion-blocking layer were not provided, and said dopant diffusion-blocking layer comprising at least one layer of metal silicide which is adjacent to one of the group consisting of said p-type semiconductor layer and said n-type semiconductor layer.

2. The multijunction semiconductor device of claim 1, wherein at least one semiconductor layer consists of a hydrogenated amorphous semiconductor material.

3. The multijunction semiconductor device of claim 1, wherein the metal silicide is selected from the group consisting of chromium silicide, nickel silicide, niobium silicide, molybdenum silicide, palladium silicide, tantalum silicide, tungsten silicide, iridium silicide and platinum silicide.

4. The multijunction semiconductor device of claim 1, wherein said dopant diffusion-blocking layer comprises a layer of metal provided on each of its opposite sides with a layer of metal silicide, wherein the metal in the layer of metal silicide is selected from the group consisting of the same metal as the metal in said layer of metal and metals different from the metal in said layer of metal.

5. The multijunction semiconductor device of claim 1, wherein said dopant diffusion-blocking layer comprises:
   (1) a layer of metal silicide;
   (2) a layer of a first metal provided on one surface of the layer of metal silicide, wherein said first metal is selected from the group consisting of the same metal as the metal in the layer of metal silicide and metals different from the metal in the layer of the metal silicide; and
   (3) a layer of a material selected from the group consisting of a second metal and a transparent conducting oxide, provided on the surface of the layer of the first metal which is not adjacent to the layer of metal silicide.

6. The multijunction semiconductor device of claim 5, wherein the transparent conducting oxide is selected from the group consisting of indium tin oxide, tin oxide, indium oxide and cadmium tin oxide.

7. The multijunction semiconductor device of claim 5, wherein the transparent conducting oxide is selected from the group consisting of tin oxide and a compound of tin oxide and indium oxide.

8. The multijunction semiconductor device of claim 1, wherein said dopant diffusion-blocking layer comprises only a layer of metal silicide.

9. The multijunction semiconductor device of claim 1, wherein said dopant diffusion-blocking layer comprises:
   (1) a layer of metal silicide; and
   (2) a layer of metal provided on one of the two surfaces of the layer of metal silicide, wherein the metal in the layer of metal silicide is selected from the group consisting of the same metal as the metal in the layer of metal and metals different from the metal in the layer of metal.

10. A multijunction semiconductor device comprising at least one p-type semiconductor layer, at least one n-type semiconductor layer, at least one dopant diffusion-blocking layer, and an electrode provided on one of said p-type semiconductor layer and said n-type semiconductor layer, wherein each semiconductor layer is made of a material selected from the group consisting of amorphous semiconductor material and amorphous semiconductor material containing microcrystals, said dopant diffusion-blocking layer being provided between a p-type semiconductor layer and an n-type semiconductor layer which would be in contact with each other if the dopant diffusion-blocking layer were not provided, and said diffusion-blocking layer comprising at least one layer of metal silicide which is adjacent to one of said p-type semiconductor layer and said n-type semiconductor layer.

11. The multijunction semiconductor device of claim 10, wherein a dopant diffusion-blocking layer is also provided between the electrode and a semiconductor layer which would be in contact with the electrode if the dopant diffusion-blocking layer were not provided.

12. The multijunction semiconductor device of claim 10, wherein said dopant diffusion-blocking layer comprises a layer of metal provided on each of its opposite sides with a layer of metal silicide, wherein the metal in the layer of metal silicide is selected from the group consisting of the same metal and a metal different from the metal in said layer of metal.

13. The multijunction semiconductor device of claim 10, wherein said dopant diffusion-blocking layer comprises:
   (1) a layer of metal silicide;
   (2) a layer of a first metal provided on one surface of the layer of metal silicide, wherein said first metal is selected from the group consisting of the same metal as the metal in the layer of metal silicide and metals different from the metal in the layer of the metal silicide; and
   (3) a layer selected from the group consisting of a second metal and of a transparent conducting oxide, provided on the surface of the layer of the first metal which is not adjacent to the layer of metal silicide.

14. The multijunction semiconductor device of claim 10, wherein said dopant diffusion-blocking layer comprises only a layer of metal silicide.

15. The multijunction semiconductor device of claim 10, wherein said dopant diffusion-blocking layer comprises:
   (1) a layer of metal silicide; and
   (2) a layer of metal provided on one of the two surfaces of the layer of metal silicide, wherein the metal in the layer of metal silicide is selected from the group consisting of the same metal as the metal in the layer of metal and metals different from the metal in the layer of metal.

* * * * *